(12) United States Patent
Zhai et al.

(10) Patent No.: US 7,253,504 B1
(45) Date of Patent: Aug. 7, 2007

(54) INTEGRATED CIRCUIT PACKAGE AND METHOD

(75) Inventors: Jun Zhai, Mountain View, CA (US); Jinsu Kwon, San Jose, CA (US); Richard C. Blish, II, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 240 days.

(21) Appl. No.: 11/010,784

(22) Filed: Dec. 13, 2004

(51) Int. Cl.
*H01L 23/48* (2006.01)
*H01L 23/12* (2006.01)
*H05K 1/11* (2006.01)
*H01R 12/04* (2006.01)

(52) U.S. Cl. ......... 257/668; 257/E23.06; 257/E23.062; 257/E23.016; 257/E23.004; 257/E23.067; 257/700; 257/701; 257/702; 257/703; 257/778; 257/738; 257/737; 257/734; 257/758; 174/262; 361/792

(58) Field of Classification Search .......... 257/E23.06, 257/E23.062, E23.196, E23.004, E23.067, 257/668, 778, 700–703, 758, 734, 737, 738, 257/698, 690–693; 174/262; 36/792
See application file for complete search history.

(56) References Cited

U.S. PATENT DOCUMENTS

| | | | |
|---|---|---|---|
| 3,798,762 A * | 3/1974 | Harris et al. ................ 29/846 |
| 4,937,707 A | 6/1990 | McBride et al. |
| 4,987,100 A | 1/1991 | McBride et al. |
| 5,098,533 A | 3/1992 | Duke et al. |
| 5,223,741 A | 6/1993 | Bechtel et al. |
| 5,571,608 A | 11/1996 | Swamy |
| 5,900,675 A | 5/1999 | Appelt et al. |
| 5,998,043 A * | 12/1999 | Sasaki et al. ................ 428/627 |
| 6,006,428 A * | 12/1999 | Feilchenfeld et al. ......... 29/852 |
| 6,177,728 B1 | 1/2001 | Susko et al. |
| 6,178,093 B1 * | 1/2001 | Bhatt et al. ................ 361/795 |
| 6,285,080 B1 * | 9/2001 | Bezama et al. ............. 257/738 |
| 6,355,364 B1 | 3/2002 | Japp et al. |
| 6,356,451 B1 * | 3/2002 | Nakagawa et al. ......... 361/760 |
| 6,387,830 B1 | 5/2002 | Blumberg et al. |
| 6,399,892 B1 | 6/2002 | Milkovich et al. |
| 6,516,513 B2 | 2/2003 | Milkovich et al. |
| 6,569,711 B1 | 5/2003 | Susko et al. |
| 6,581,280 B2 * | 6/2003 | Curcio et al. ................. 29/832 |

(Continued)

FOREIGN PATENT DOCUMENTS

JP 2001-44317 * 2/2001

OTHER PUBLICATIONS

"Invar—Nickel Iron Alloy"; Chemical Formula; AZoM™—Metals, Ceramics, Polymers, Composites, An Engineers Resource . . . Copyright © 2004 by AZoM™.com Pty.Ltd.; dated Aug. 24, 2004; 4 pages.

(Continued)

*Primary Examiner*—Alexander Oscar Williams
(74) *Attorney, Agent, or Firm*—Foley & Lardner LLP (57) ABSTRACT

An integrated circuit package includes a substrate having a central axis dividing the substrate into an upper half and a lower half and an integrated circuit coupled to the substrate. A layer is provided within the substrate in the lower half thereof that is configured to resist warpage of the integrated circuit package, the layer provided a distance from the central axis.

22 Claims, 5 Drawing Sheets

U.S. PATENT DOCUMENTS

| | | |
|---|---|---|
| 6,586,352 B1 | 7/2003 | Blumberg et al. |
| 6,639,155 B1 * | 10/2003 | Bupp et al. .................. 174/260 |
| 6,660,945 B2 * | 12/2003 | Boyko et al. ............... 174/262 |
| 6,720,502 B1 | 4/2004 | Alcoe et al. |
| 6,759,738 B1 | 7/2004 | Fallon et al. |
| 2001/0033889 A1 * | 10/2001 | Bhatt et al. .................... 427/1 |
| 2004/0144561 A1 * | 7/2004 | Osanai et al. ............... 174/252 |
| 2005/0218503 A1 * | 10/2005 | Abe et al. ................... 257/700 |

OTHER PUBLICATIONS

Chapter B: Flip-Chip Technology; "Introduction to Flip-Chip techniques"; printed from internet at http://extra.ivf.se/ngl/B-Flip-Chip/ChapterB1.htm; dated Jul. 12, 2004; 7 pages.

* cited by examiner

INTEGRATED CIRCUIT PACKAGE AND METHOD

BACKGROUND

The present invention relates generally to the field of integrated circuits. More specifically, the present invention relates to integrated circuit packages and methods of manufacturing such packages.

Integrated circuits (ICs), such as ultra-large scale integrated (ULSI) circuits, can include as many as one million transistors or more. The ULSI circuit can include complementary metal oxide semiconductor (CMOS) field effect transistors (FETS). ICs also often include flash memory cells. Such devices typically include a silicon, silicon-germanium, or other semiconductor substrate, above which are provided any of a variety of structures, such as vias, conductive lines, capacitors, resistors, isolation structures, contacts, interconnects, etc.

Flip chip integrated circuit packages utilize integrated circuits in an orientation that allows for relatively simple connection of the integrated circuits to the substrate. The integrated circuits are arranged face down on a substrate (e.g., an organic or ceramic substrate material) such that the active circuitry provided on a top surface of the integrated circuit is electrically connected (e.g., soldered) in contact with features provided in the substrate. In this manner, the features (i.e., the active circuitry) provided on the top surface of integrated circuit are aligned with the appropriate features on the underlying substrate. One advantageous feature of utilizing flip chip packaging is that the necessity to electrically connect the integrated circuit to the underlying substrate using wire bonding or another technique is eliminated. Another advantageous feature is that the overall size of the integrated circuit may be reduced as compared to packages that require wire bonding connections between the integrated circuit and the underlying substrate.

Figure 1:
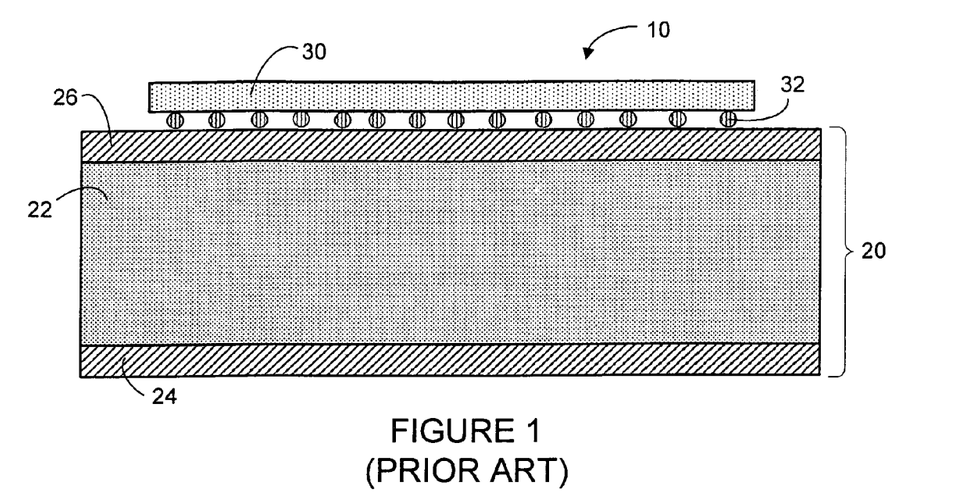
FIG. 1 is a schematic cross-sectional view of a flip-chip integrated circuit package having a conventional configuration.

FIG. 1 is a schematic cross-sectional view showing a portion 10 of a conventional flip chip integrated circuit package. Portion 10 includes a substrate 20 having an integrated circuit 30 electrically connected thereto. Integrated circuit 30 is connected to substrate 20 using solder balls 32 or another method.

Substrate 20 includes a core 22 provided between a first buildup layer 24 and a second buildup layer 26. Buildup layers 24 and 26 include a variety of circuits and/or other components. Core 22 comprises an organic or ceramic material and a number of metal features (e.g., copper, aluminum) (not shown) for electrically connecting attached integrated circuits to other portions of the package.

One difficulty with the arrangement shown in FIG. 1 is that thermal stresses may be induced following the processing of the package. For example, the substrate comprises an organic material having a coefficient of thermal expansion (CTE) that is between approximately 17 and 20 ppm/° C. while the substrate is typically made of a semiconductor material such as silicon, silicon-germanium, gallium arsenide, or other III-V semiconductor materials. The integrated circuit conventionally has a CTE that is between approximately 2 and 3 ppm/° C. During processing of the package, the temperature of the package is approximately 170° C. After processing is completed, the temperature of the package returns to room temperature, at which point the substrate contracts more than the integrated circuit coupled thereto. The result of the thermally induced shrinkage differential between the substrate and the integrated circuit is that a stress is induced in the package that may ultimately cause a defect in the package. For example, a bending moment may be induced in the package that causes the components of the package (e.g., the integrated circuit or die and the substrate) to bend into a convex shape, which may cause cracks to develop at the interface at which the integrated circuit is coupled to the substrate. In such a case, electrical connections between the integrated circuit in the substrate may be compromised, resulting in a device which may not function in an expected manner.

It would be advantageous to provide an improved integrated circuit package (e.g., a flip chip package) that is configured to resist or compensate for thermally induced stresses in the package. It would also be advantageous to provide an integrated circuit package that utilizes commonly available materials to produce an integrated circuit package that resists thermally induced stresses. It would also be advantageous to provide a method of producing an integrated circuit package that resists thermally induced stresses.

SUMMARY

An exemplary embodiment relates to an integrated circuit package that includes a substrate having a central axis dividing the substrate into an upper half and a lower half. The integrated circuit package also includes an integrated circuit coupled to the substrate. A layer is provided within the substrate that is configured to resist warpage of the integrated circuit package. The layer is provided a distance from the central axis and within the lower half of the substrate.

Another exemplary embodiment relates to a flip-chip integrated circuit package that includes a substrate comprising a material having a first coefficient of thermal expansion. The substrate having a top half and a bottom half. An integrated circuit is coupled to the top half of the substrate and includes a second coefficient of thermal expansion that is less than that of the first coefficient of thermal expansion. A warpage control layer is provided in the bottom half of the substrate and includes a material configured to resist bending of the flip-chip integrated circuit package.

Another exemplary embodiment relates to method for producing an integrated circuit package that includes providing a substrate comprising at least one of a ceramic material and an organic material and attaching an integrated circuit to a surface of the substrate. The substrate has an axis which divides the substrate into a top half and a bottom half, and includes a material configured to offset warpage of the integrated circuit package. The material is provided within the bottom half of the substrate.

DETAILED DESCRIPTION OF EXEMPLARY EMBODIMENTS

According to an exemplary embodiment, an integrated circuit package (e.g., a flip-chip package) may be produced which includes a layer configured or designed to resist or compensate for a differential in a coefficient of thermal expansion between an integrated circuit (IC) or die and a substrate to which the IC or die is attached. According to one exemplary embodiment, a layer of material (i.e., a warpage control layer) is provided within the substrate to offset the thermal expansion of the integrated circuit and the substrate. The warpage control layer may be made from a material that has a relatively high modulus and a relatively low coefficient of thermal expansion.

Figure 2:
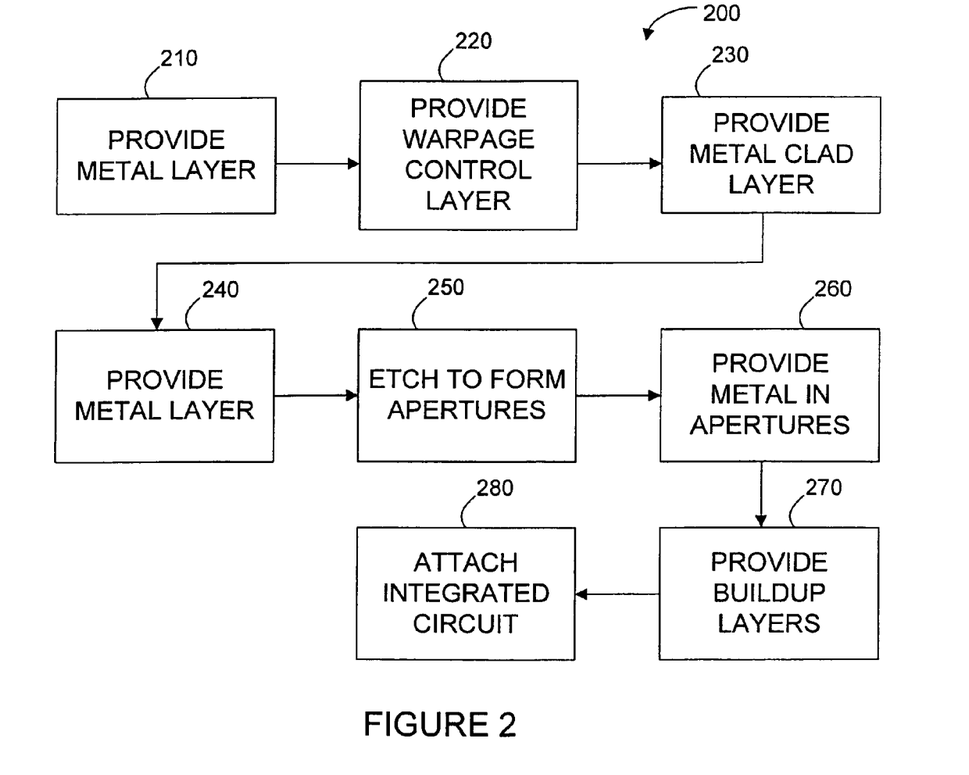
FIG. 2 is a flow chart illustrating a method for producing an integrated circuit package according to an exemplary embodiment.

FIG. 2 is a flow diagram illustrating steps in a method 200 of forming a flip-chip integrated circuit package according to an exemplary embodiment. The method according to the exemplary embodiment shown in FIG. 2 will be described with respect to FIGS. 3-13.

Figure 3:
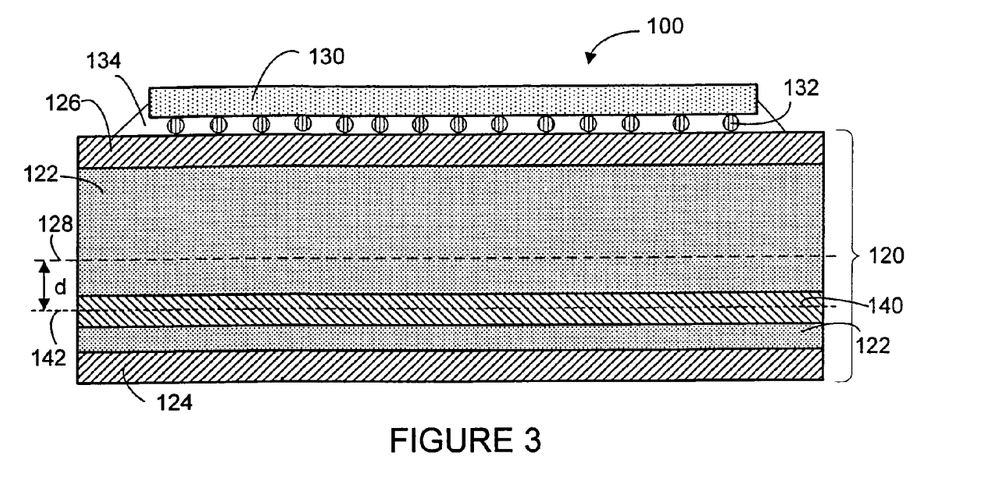
FIG. 3 is a schematic cross-sectional view of an integrated circuit package according to an exemplary embodiment.

FIG. 3 illustrates a portion 100 of a flip-chip integrated circuit package according to an exemplary embodiment. An integrated circuit 130 is electrically connected or coupled to a substrate 120 by a plurality of solder balls 132. According to various other exemplary embodiments, other methods of electrically connecting integrated circuits 132 substrate 120 may be utilized. According to an exemplary embodiment, solder balls have diameters of between approximately 50 and 200 μm and are made from alloys of comprising materials such as lead, tin, copper, and silver.

An optional underfill material 134 may also be provided to provide additional support in coupling integrated circuit 132 substrate 120. According to an exemplary embodiment, underfill material 134 is an adhesive material such as an epoxy, and may also comprise silicon or another filler material within the epoxy according to various other exemplary embodiments. According to other exemplary embodiments, underfill material 134 may comprise one or more of an epoxy material, silica, titania, and aluminum oxide.

Substrate 120 includes a core comprising a material 122, a first buildup layer 124 and a second buildup layer 126. Buildup layers 124 and 126 may comprise polyimide or another organic material. As described with respect to the arrangement shown in FIG. 1, first buildup layer 124 and second buildup layer 126 include a variety of circuitry. Material 122 includes an organic material such as epoxy resin according to an exemplary embodiment. According to various other exemplary embodiments, the organic material used to form material 122 may be selected from Cyanate Ester (Bismaleimide Triazine (BT)), Epoxy (FR-4), and polyimide. According to a particular exemplary embodiment, material 122 includes an epoxy resin and woven glass composite material. According to other exemplary embodiments, material 122 may be a ceramic material instead of an organic material. For example, material 122 may comprise aluminum oxide or another ceramic material. According to an exemplary embodiment, substrate 120 has a thickness between approximately 0.8 mm and 1.5 mm.

For ease of reference, the embodiment shown in FIG. 3 does not illustrate the various metal features that may be included in material 122. Examples of such features will be shown and described with respect to FIGS. 4-13.

As shown in FIG. 3, a layer 140 of material is provided within material 122. According to exemplary embodiment, layer 140 is a warpage control layer, and is configured to compensate for thermal expansion and contraction of integrated circuit 130 and the organic or ceramic material used to form material 122. For example, layer 140 may comprise a metal material that has a coefficient of thermal expansion that is selected so as to offset or compensate for the relatively high degree of thermal expansion that may be exhibited by the organic or ceramic material that is utilized as material 122.

According to an exemplary embodiment, layer 140 comprises a laminated metal structure. According to a particular embodiment, layer 140 includes a layer of Invar (an alloy of nickel and iron) provided intermediate or between layers of copper. Such a structure may be referred to as a copper-Invar-copper layer. According to other exemplary embodiments, layer 140 may comprise other materials, such as tungsten, chromium, molybdenum, and nickel. It is considered to be advantageous to provide a material for layer 140 that exhibits a relatively large modulus and a relatively low coefficient of thermal expansion. For example, the modulus of layer 140 may be between approximately 70 GPa and 150 GPa according to an exemplary embodiment. The coefficient of thermal expansion of the material used for layer 140 may be between approximately 1 and 6 ppm/° C. (for temperatures under 450 degrees Kelvin) according to an exemplary embodiment. According to another exemplary embodiment, the coefficient of thermal expansion of the material used for layer 140 may be between approximately 2 and 4 ppm/° C., and approximately 2.3 pm/° C. in an exemplary embodiment in which a copper-Invar-copper material is utilized.

The thickness and position of layer 140 are selected or chosen to offset or compensate for a bending moment that may be induced as a result of thermal expansion or contraction of integrated circuit 130 and material 122. In this manner, it is intended that the occurrence of bending of portion 100 will be reduced or eliminated, thus reducing or eliminating the occurrence of delamination between the integrated circuit or die and the underlying substrate.

According to an exemplary embodiment, the thickness of layer 140 is between approximately 50 μm and 150 μm, and according to a particular exemplary embodiment is approximately 100 μm. According to various other exemplary embodiments, the thickness of layer 140 may differ from that described with respect to the exemplary embodiment shown in FIG. 3.

Layer 140 is positioned within material 122 at a location selected to provide adequate resistance to bending of material 122. As shown in FIG. 3, the centerline 142 of layer 140 is offset from the centerline 128 (e.g., the central or neutral axis which divides substrate 120 into an upper half and a lower half) of substrate 120 by a distance d. In this matter, it can be said that layer 140 is provided within material 122 asymmetrically with respect to the thickness of substrate 120. As shown in FIG. 3, layer 140 is provided in a lower or bottom portion of material 122.

According to an exemplary embodiment, the thickness of layer 140 and the distance d from the centerline of material 122 may be calculated using the following general relationship:

$$M=(\alpha_{sub}-\alpha_{wcl})*\Delta T*E_{wcl}*t*d$$

where M is the moment of layer 140, $\alpha_{sub}$ is the coefficient of thermal expansion of substrate 120, $\alpha_{wcl}$ is the coefficient of thermal expansion of layer 140, $\Delta T$ is the change in temperature experienced by the package, $E_{wcl}$ is the Young's modulus of layer 140, t is the thickness of layer 40, and d is the distance between layer 140 and the central axis of substrate 120.

According to an exemplary embodiment, substrate 120 has a coefficient of thermal expansion of approximately 17 ppm/° C., the coefficient of thermal expansion of approximately 6 ppm/° C., the Young's modulus of a copper-Invar-copper layer 140 is approximately 120 gigapascals (GPa), the thickness of layer 140 is approximately 0.1 mm, and the distance between layer 140 and the central axis of substrate 120 is approximately 0.3 mm. According to this exemplary embodiment, the moment of layer 140 is approximately 6 megapascal millimeters (MPa*mm).

With regard to FIGS. 2 and 4-13, method 200 for producing an integrated circuit package such as that shown in FIG. 3 will be described. It should be noted that FIG. 3 does not show various metal features as will be described with respect to FIGS. 4-13. However, it should be understood that substrate 120 shown FIG. 3 may includes features similar to those as will be described with respect to FIGS. 4-13 (or other features in addition to or in place of such features according to various other exemplary embodiments).

Figure 4:
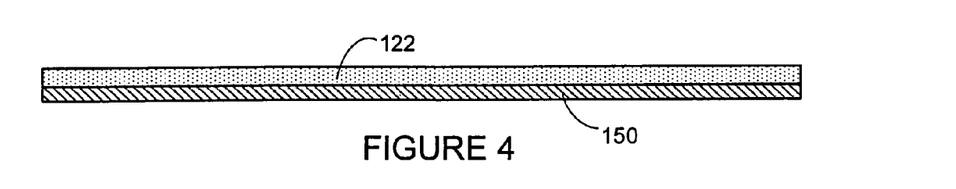
FIG. 4 is a schematic cross-sectional view illustrating a step in a method of producing an integrated circuit package according to an exemplary embodiment.

In a step 210 (FIG. 2) shown in FIG. 4, a layer 150 of metal such as a copper foil is provided. Layer 150 is configured for providing an electrically conducted medium to allow electrical communication between metal features provided within substrate 120 and buildup layer 124. According to an exemplary embodiment, the thickness of layer 150 is between approximately 50 µm and 200 µm, and according to a particular exemplary embodiment has a thickness of approximately 100 µm. A portion of material 122 is then provided above or over layer 150. As described above, material 122 comprises an organic or ceramic material such as BT according to exemplary embodiment.

Figure 5:
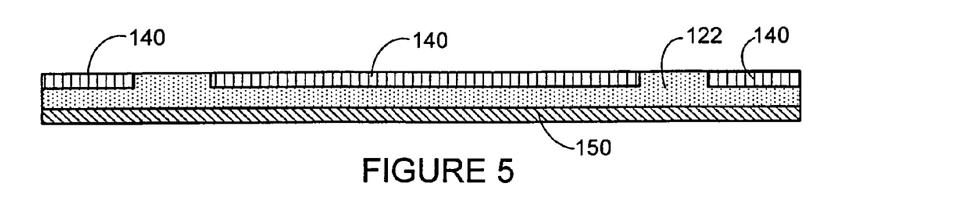
FIG. 5 is a schematic cross-sectional view illustrating another step in a method of producing an integrated circuit package according to an exemplary embodiment.
Figure 6:
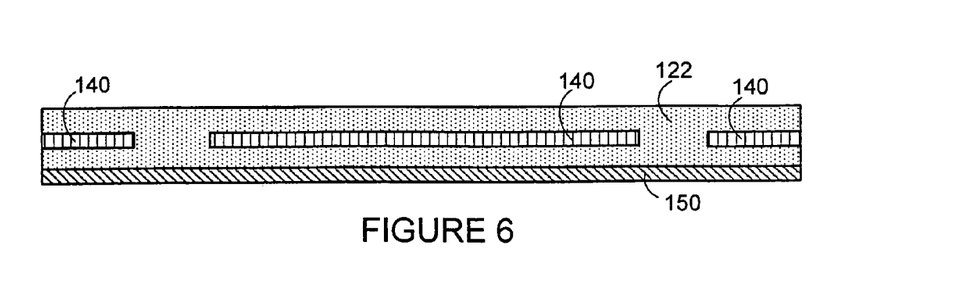
FIG. 6 is a schematic cross-sectional view illustrating another step in a method of producing an integrated circuit package according to an exemplary embodiment.

In a step 220 shown in FIG. 5, layer 140 (e.g., a warpage control layer) is provided above the portion of material 122 provided above layer 150. Layer 140 is provided as a discontinuous layer of metal. According to another exemplary embodiment, layer 140 may be provided as a continuous layer of metal. Material 122 is provided in the areas of discontinuity in layer 140 and above layer 140 (see, e.g., FIGS. 5-6). As described above, layer 140 comprises a material that includes a relatively high modulus and a relatively low coefficient of thermal expansion. According to exemplary embodiment, the layer 140 comprises a laminate of copper, Invar, and copper.

Figure 7:
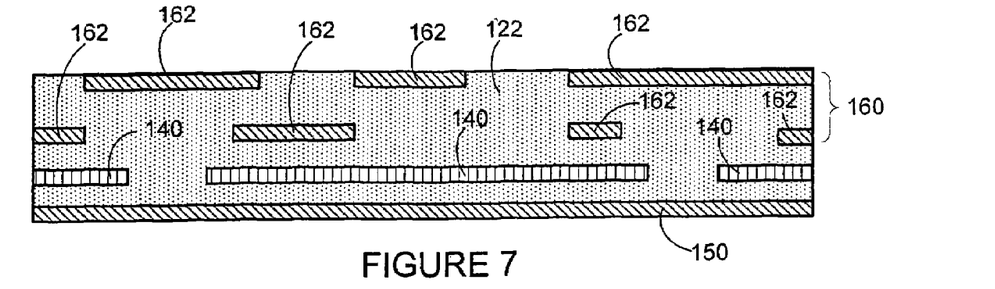
FIG. 7 is a schematic cross-sectional view illustrating another step in a method of producing an integrated circuit package according to an exemplary embodiment.
Figure 8:
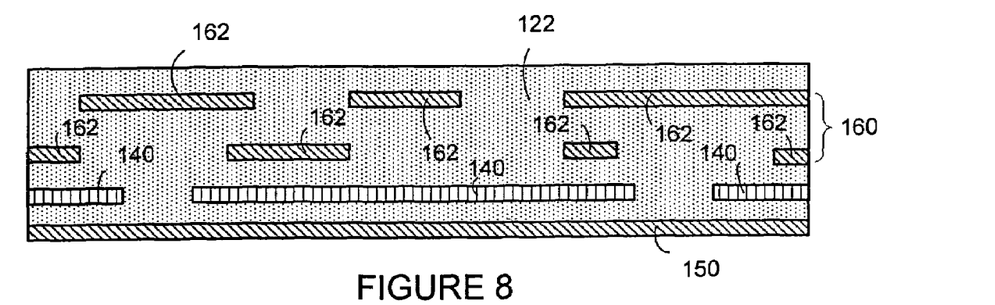
FIG. 8 is a schematic cross-sectional view illustrating another step in a method of producing an integrated circuit package according to an exemplary embodiment.

In a step 230 shown in FIG. 7, a clad laminate (shown as reference numeral 160) is provided above material 122 provided above layer 140. The laminate may comprise material 122 and metal features 162 (e.g., copper features) laminated on material 122. According to an exemplary embodiment, the clad laminate may be manufactured separately and provided above material 122 or may be provided in individual layers (e.g., deposit metal features, provide material 122, deposit additional metal features, etc.). Those of skill in the art will appreciate that any of a variety of techniques may be used to provide clad laminate 160. Metal features 162 provided within substrate 120 are provided to provide electrical connections between the various components within the integrated circuit package. Additional material 122 may be provided above metal features 162.

Figure 9:
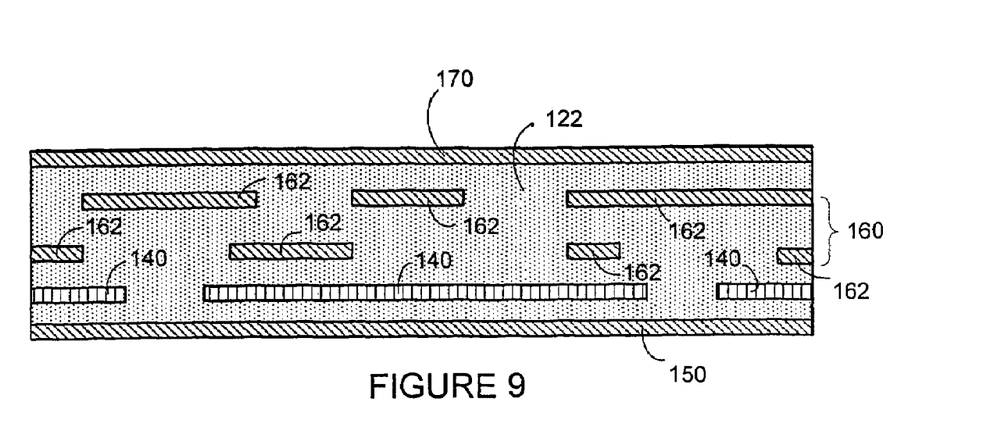
FIG. 9 is a schematic cross-sectional view illustrating another step in a method of producing an integrated circuit package according to an exemplary embodiment.

In a step 240 shown in FIG. 9, a layer 170 of metal such as a copper foil is provided. Layer 170 is configured for providing an electrically conductive medium to allow electrical communication between metal features provided within substrate 120 and buildup layer 126. According to an exemplary embodiment, the thickness of layer 170 is between approximately 50 µm and 200 µm, and according to a particular exemplary embodiment is approximately 100 µm.

The resultant structure (sometimes referred to, e.g., as the "core" for the substrate) includes an organic or ceramic material (e.g., material 122) sandwiched between two layers of metal (e.g., layers 150 and 170), and having metal features (e.g., features 162) and a warpage control layer (e.g., layer 140) provided therein. As indicated with respect to FIG. 3, layer 140 is provided a distance away from the centerline of the core to provide a balance of moments that result from thermal expansion/contraction of the components of the integrated circuit package.

Figure 10:
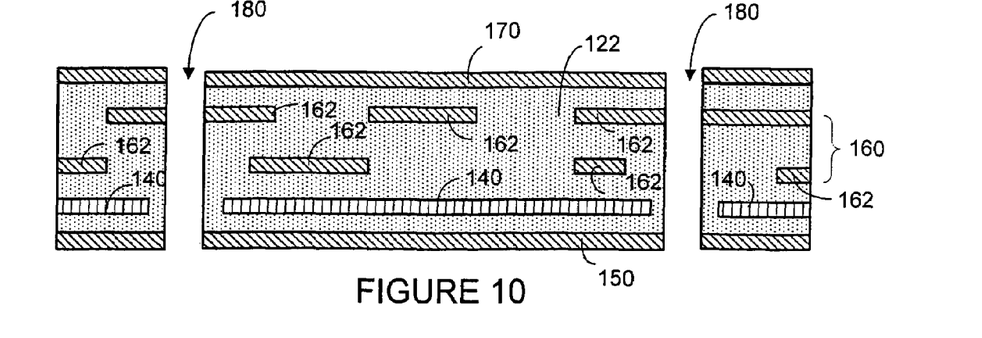
FIG. 10 is a schematic cross-sectional view illustrating another step in a method of producing an integrated circuit package according to an exemplary embodiment.

In a step 250 shown in FIG. 10, a portion of the structure (e.g., the core) shown in FIG. 9 is removed by etching or other means to form apertures or holes 180 through the structure (e.g., etching with cupric chlorite). Apertures 180 are formed in areas corresponding to the areas of discontinuity in layer 140. According to another exemplary embodiment in which layer 140 is provided as a continuous layer, apertures 180 may be formed in a process that includes removing a portion of layer 140. As will be appreciated, any of a variety of methods may be used to form apertures 180, including a variety of known masking and etching techniques.

According to an exemplary embodiment, the width of apertures 180 are between approximately 50 µm and 200 µm. According to a particular exemplary embodiment, apertures 180 have a width of approximately 120 µm.

Figure 11:
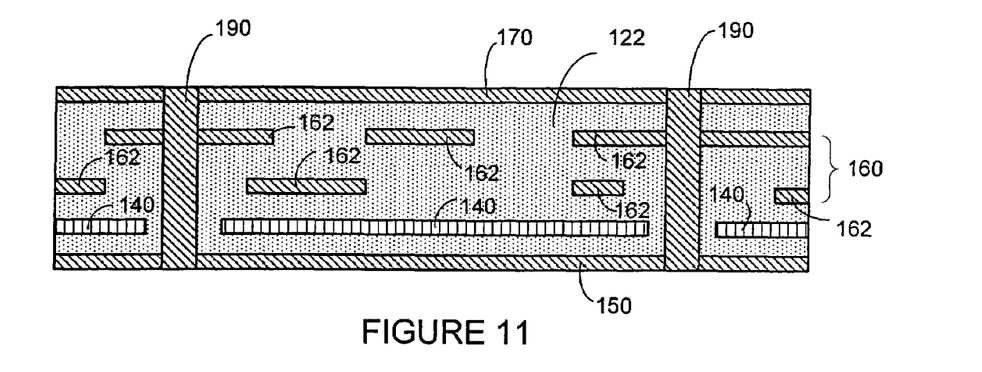
FIG. 11 is a schematic cross-sectional view illustrating another step in a method of producing an integrated circuit package according to an exemplary embodiment.

In a step 260 shown in FIG. 11, a metal material 190 (e.g., copper or aluminum) is provided within apertures 180 to provide enhanced electrical and/or thermal conductivity. Metal material 190 is sometimes referred to as a metal plating.

Figure 12:
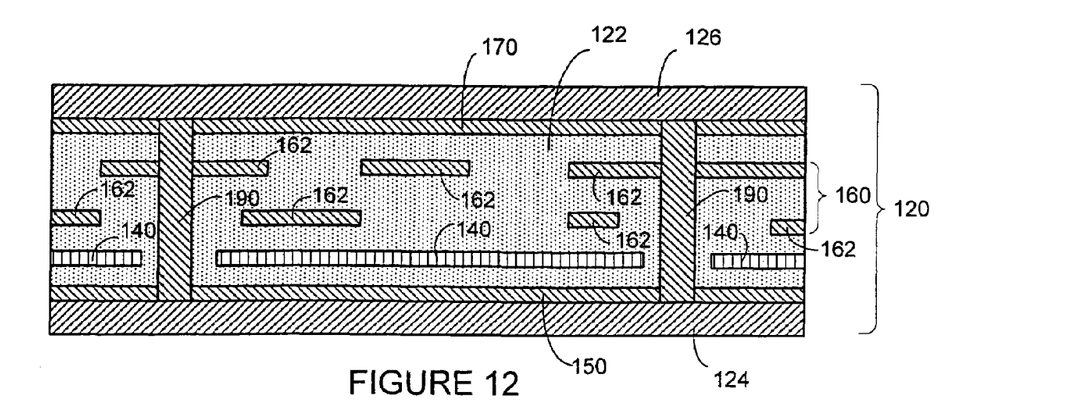
FIG. 12 is a schematic cross-sectional view illustrating another step in a method of producing an integrated circuit package according to an exemplary embodiment.

In a step 270 shown in FIG. 12, buildup layer 124 and buildup layer 126 are provided on opposite sides of the core to complete substrate 120. According to an exemplary embodiment, each of the buildup layers are provided in multiple steps. For example, according to a particular embodiment, a first layer of material is applied to the core, after which the buildup material is partially cured at elevated temperatures. After partial curing of the first buildup layer, vias or other structures may be provided. For example, vias may be formed in the buildup material using a laser or a lithographic etching process followed by metal deposition. This process may be repeated to provide multiple layers above the first layer of material until the desired complete buildup layer is formed. According to another exemplary embodiment, instead of providing buildup layers 124 and 126 after formation of the core, the core may be built upon buildup layer 124 (e.g., in step 210, metal layer 150 may be provided on top of buildup layer 124).

Figure 13:
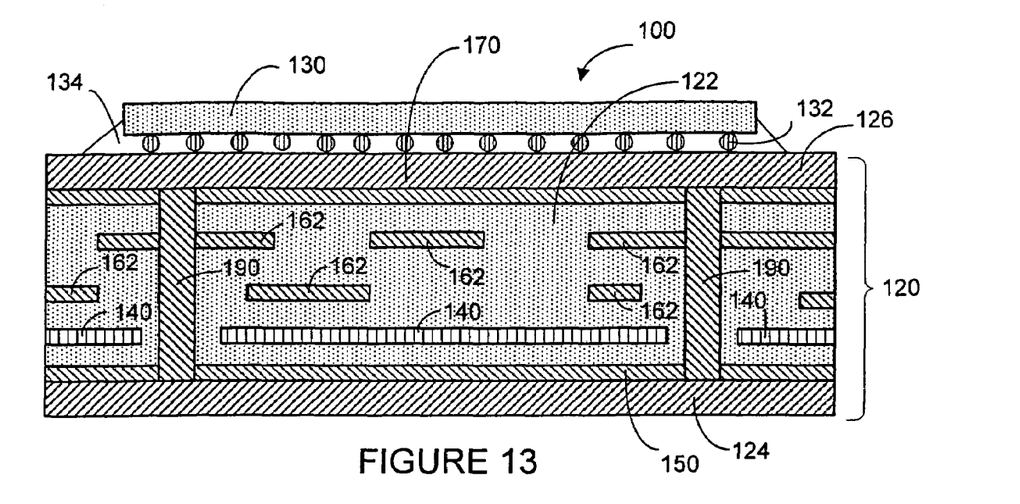
FIG. 13 is a schematic cross-sectional view illustrating another step in a method of producing an integrated circuit package according to an exemplary embodiment.

In a step 280 shown in FIG. 13, integrated circuit 130 is coupled or attached to substrate 120 (e.g., using solder balls 132 and optionally underfill material 134). The resultant integrated circuit package includes an integrated circuit coupled and electrically connected to a substrate that includes a layer of material configured to resist or compensate for warpage that may result from thermal expansion and contraction of the various materials used to form the integrated circuit package. The bottom portion of the substrate has a lower overall coefficient of thermal expansion due to the presence of layer 140, which acts to counteract the thermal expansion/contraction of the upper or top portion of the substrate. As a result, damage to the package (e.g., cracking along the interface between the integrated circuit and the substrate) may be reduced or eliminated.

Another advantageous feature of providing a metal material for layer 140 (e.g., copper-Invar-copper according to one exemplary embodiment) is that layer 140 may be used to provide an inherent power plane for substrate 120 (e.g., eliminating the need for another copper layer). Such a material also may provide relatively good EMI/RFI shielding for the package, and may have a relatively predictable and acceptable adhesion with the organic or ceramic material used in substrate 120.

It is important to note that the construction and arrangement of the integrated circuit package as shown in the various exemplary embodiments is illustrative only. Although only a few embodiments of the present inventions have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present invention as defined in the appended claims. The order or sequence of any process or method steps may be varied or re-sequenced according to alternative embodiments. Other substitutions, modifications, changes and omissions may be made in the design, operating conditions and arrangement of the preferred and other exemplary embodiments without departing from the scope of the present inventions as expressed in the appended claims.

What is claimed is:

1. An integrated circuit package comprising:
   a substrate having a central axis dividing the substrate into an upper half and a lower half;
   an integrated circuit coupled to the substrate; and
   a layer provided within the substrate at a distance from the central axis and within the lower half of the substrate;
   wherein the thickness and position of the layer are configured to resist warpage of the integrated circuit package due to thermal stresses, the thickness of the layer being between approximately 50 μm and 150 μm.

2. The integrated circuit package of claim 1, wherein the layer comprises Invar.

3. The integrated circuit package of claim 2, wherein the layer further comprises copper.

4. The integrated circuit package of claim 1, wherein the layer comprises at least one material selected from the group consisting of tungsten, chromium, molybdenum, and combinations thereof.

5. The integrated circuit package of claim 1, wherein the substrate includes a first buildup layer adjacent a first surface of the substrate and a second buildup layer adjacent a second surface of the substrate.

6. The integrated circuit package of claim 1, wherein the integrated circuit has a first coefficient of thermal expansion and the substrate has a second coefficient of thermal expansion, the first coefficient of thermal expansion being less than the second coefficient of thermal expansion.

7. The integrated circuit package of claim 6, wherein the substrate has a coefficient of thermal expansion of between approximately 17 and 20 ppm/° C. and the integrated circuit has a coefficient of thermal expansion of between approximately 2 and 3 ppm/° C.

8. The integrated circuit package of claim 1, wherein the distance of the layer to the central axis of the substrate is optimized to offset the thermal stress of the substrate and the integrated circuit.

9. The integrated circuit package of claim 1, wherein the substrate comprises an organic material.

10. The integrated circuit package of claim 1, wherein the integrated circuit package is a flip-chip package.

11. A flip-chip integrated circuit package comprising:
    a substrate comprising a material having a first coefficient of thermal expansion, the substrate having a top half and a bottom half;
    an integrated circuit coupled to the top half of the substrate and having a second coefficient of thermal expansion less than that of the first coefficient of thermal expansion; and
    a warpage control layer provided in the bottom half of the substrate, the warpage control layer comprising a material configured to resist bending of the flip-chip integrated circuit package and having a thickness of between approximately 50 μm and 200 μm.

12. The flip-chip integrated circuit package of claim 11, wherein the warpage control layer has a coefficient of thermal expansion of between approximately 1 ppm/° C. and 6 ppm/° C.

13. The flip-chip integrated circuit package of claim 11, wherein the warpage control layer comprises an alloy of nickel and iron.

14. The flip-chip integrated circuit package of claim 13, wherein the warpage control layer further comprises copper.

15. The flip-chip integrated circuit package of claim 11, wherein the material having a first coefficient of thermal expansion comprises at least one of a ceramic material and an organic material.

16. The flip-chip integrated circuit package of claim 11, wherein at least one of the position and thickness of the warpage control layer are selected to offset a moment generated as a result of thermal shape changes of at least one of the integrated circuit and the material having a first coefficient of thermal expansion.

17. The flip-chip integrated circuit package of claim 16, wherein the thickness of the warpage control layer is between approximately 50 μm and 150 μm and the thickness of the substrate is between approximately 0.8 mm and 1.5 mm.

18. A method for producing an integrated circuit package, comprising:

provide a substrate comprising at least one of a ceramic material and an organic material;

attaching an integrated circuit to a surface of the substrate;

wherein the substrate has an axis which divides the substrate into a top half and a bottom half; and wherein the substrate includes a material configured to offset warpage of the integrated circuit package, the material provided within the bottom half of the substrate and having a thickness of between approximately 50 μm and 150 μm.

19. The method of claim 18, wherein the substrate includes at least one buildup layer and the step of attaching the integrated circuit to the substrate comprises electrically connecting the integrated circuit to circuitry provided in the at least one buildup layer.

20. The method of claim 18, wherein the material configured to offset warpage of the integrated circuit package comprises Invar and is provided as a discontinuous layer within the substrate.

21. The flip-chip integrated circuit package of claim 11, wherein the warpage control layer comprises at least one material selected from the group consisting of tungsten, chromium, molybdenum, and combinations thereof.

22. The method of claim 18, wherein the material comprises at least one material selected from the group consisting of tungsten, chromium, molybdenum, and combinations thereof.

\* \* \* \* \*